(12) United States Patent
Sun et al.

(10) Patent No.: US 6,756,545 B2
(45) Date of Patent: Jun. 29, 2004

(54) MICRO-DEVICE ASSEMBLY WITH ELECTRICAL CAPABILITIES

(75) Inventors: Decai Sun, Los Altos, CA (US); Michel A. Rosa, San Jose, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/725,836

(22) Filed: Nov. 29, 2000

(65) Prior Publication Data

US 2002/0063339 A1 May 30, 2002

(51) Int. Cl.[7] ................................................. H01B 5/00
(52) U.S. Cl. .............................. 174/138 R; 174/138 C; 310/309; 439/492; 439/31; 439/496; 200/181
(58) Field of Search ...................... 174/138 R, 138 C; 439/492, 31, 496; 200/181; 310/309

(56) References Cited

U.S. PATENT DOCUMENTS

| | | | |
|---|---|---|---|
| 5,069,742 A | 12/1991 | Bleil | |
| 5,470,797 A | 11/1995 | Mastrangelo | |
| 5,490,034 A | 2/1996 | Zavracky et al. | |
| 5,629,790 A | 5/1997 | Neukermans et al. | |
| 5,677,783 A | 10/1997 | Bloom et al. | |
| 5,870,007 A | 2/1999 | Carr et al. | |
| 5,903,380 A | 5/1999 | Motamedi et al. | |
| 5,962,949 A | * 10/1999 | Dhuler et al. ............... | 310/307 |
| 6,046,659 A | * 4/2000 | Loo et al. ..................... | 200/181 |
| 6,057,520 A | * 5/2000 | Goodwin-Johansson .... | 200/181 |
| 6,074,890 A | 6/2000 | Yao et al. | |
| 6,094,289 A | 7/2000 | Moranski et al. | |
| 6,153,839 A | * 11/2000 | Zavracky et al. ........... | 200/181 |
| 6,229,683 B1 | * 5/2001 | Goodwin-Johansson .... | 361/207 |
| 6,236,491 B1 | * 5/2001 | Goodwin-Johansson .... | 359/230 |
| 6,243,194 B1 | 6/2001 | Brazas, Jr. et al. | |
| 6,275,320 B1 | * 8/2001 | Dhuler et al. ............... | 310/306 |
| 6,299,462 B1 | 10/2001 | Biegelsen | |
| 6,303,885 B1 | * 10/2001 | Hichwa et al. ............. | 200/181 |
| 6,331,257 B1 | * 12/2001 | Loo et al. ..................... | 216/13 |
| 6,456,420 B1 | 9/2002 | Goodwin-Johansson | |

FOREIGN PATENT DOCUMENTS

| | | |
|---|---|---|
| EP | 0 502 222 A1 | 9/1992 |
| WO | WO 94/03786 | 2/1994 |

OTHER PUBLICATIONS

European Search Report; Application No. 01127498.2–1524; Apr. 9, 2002; Examiner Michel, A.

(List continued on next page.)

Primary Examiner—Dean A. Reichard
Assistant Examiner—Jinhee Lee
(74) Attorney, Agent, or Firm—Fay, Sharpe, Fagan, Minnich & McKee, LLP

(57) ABSTRACT

Provided is a ribbon structure which may be used as part of a micro-assembly including a micro-device formed on or in a device layer of a single crystal silicon substrate. The ribbon structure is also formed in the device layer, where the ribbon structure is thinned to a thickness less than the thickness of the micro-device. The ribbon structure has an electrical conductive material deposited on its surface. When implemented as part of the micro-assembly, a first end of the micro-device and a first end of a ribbon structure are interconnected, wherein the ribbon structure and out-of-plane device are formed as a single piece.

20 Claims, 5 Drawing Sheets

OTHER PUBLICATIONS

Motamedi, M. Edward; *Development of Micro–Electro–Mechanical Optical Scanner*; Society of Photo Optical Instrumentation Engineers, 36(5) pp. 1346–1353 (May 1997);.

European Search Report; Application No. 01127729.0–2217; Apr. 9, 2002; Examiner Michel, A.

Wibbeler et al.; *Parasitic of Charging Dielectric Surfaces in Capacitive Micro–Electro–Mechanical Systems (MEMS); Sensors and Actuators A*, 71 (1998) 74–80.

Walker et al.; *Focused Ion Beam Processing for Microscale Fabrication; Microelectronic Engineering* 30 (1996) 517–522.

Syms, Richard R. A.; *Refractive Collimating Microlens Arrays by Surface Tension Self–Assembly; IEEE Photonics Technology Letters*, vol. 12, No. 11, Nov. 2000, pp. 1507–1509.

Deborah S. Patterson, Flip Chip Technologies, 3701 E. University Drive, Phoenix, AZ, Seminar, *A Comparison of Popular Flip Chip Bumping Technologies* (Test, Assembly & Packaging Conference (InterPACK '97), in Kona, HW, 1997).

\* cited by examiner

MICRO-DEVICE ASSEMBLY WITH ELECTRICAL CAPABILITIES

This invention was made with United States Government support awarded by the Department of Commerce under Contract No. 70NANB8H4014. The United States Government has certain rights in this invention.

BACKGROUND OF THE INVENTION

The present invention is directed to assemblies configured using micro-electromechanical systems (MEMS) and micro-systems technology, and more particularly to improved micro-assemblies which have electrical capabilities.

The use of micro-hinges has become prevalent with the increased utilization and complexity of surface micro-machined components and systems. Typically used in the implementation of out-of-plane or vertically oriented micro-device designs, the micro-hinge is usually fabricated in a minimum two-layer, though typically three-layer, polysilicon process. Such a hinge, known as a staple hinge 10, is illustrated in FIG. 1 integrally connected with micro-mirror 12, and is used to attain out-of-plane motion. The multi-step fabrication process, includes depositing a layer which is then patterned and etched. Next a second layer is deposited, patterned and etched in such a way that after removing any filling material, the first layer is free to move in a prescribed path, while being held in place by the second layer. This structure creates a rotating joint implemented in MEMS or micro-systems to permit for the mechanical movement required for out-of-plane or vertically oriented devices.

While the described staple hinge provides a useful mechanical function, a drawback is the difficulty to incorporate electrical connections between the hinges and the micro-element to which it is attached. This difficulty is illustrated in FIG. 1, where it is shown that the lifted structure, i.e. micro-mirror 12 is floating above substrate 14. Providing an electrical connection between these physically separated elements raises significant obstacles to implementing a three-dimensional electrically actuated MEMs device such as an electrostatically driven micro-mirror. In order to realize scanning of a mirror, it is necessary for the mirror to be pushed and/or pulled mechanically by an actuator placed on substrate 14. Therefore it has been deemed desirable to develop micro-assemblies which are capable of providing an electrical connection between a hinge element and a micro-device, using a simplified structural arrangement.

SUMMARY OF THE INVENTION

Provided is a micro-electromechanical assembly including a micro-device formed in the device layer of a silicon-on-insulator substrate. A ribbon structure is formed in the same device layer, where the ribbon structure is less than the thickness of the micro-device. A connection interface provides a connection point between a first end of the micro-device and a first end of a ribbon structure, wherein the ribbon structure and micro-device are integrated as a single assembly. An electrical conductor is formed extending from one end of the ribbon structure to the micro-device tethered at the other end.

DETAILED DESCRIPTION OF PREFERRED EMBODIMENTS

Figure 1:
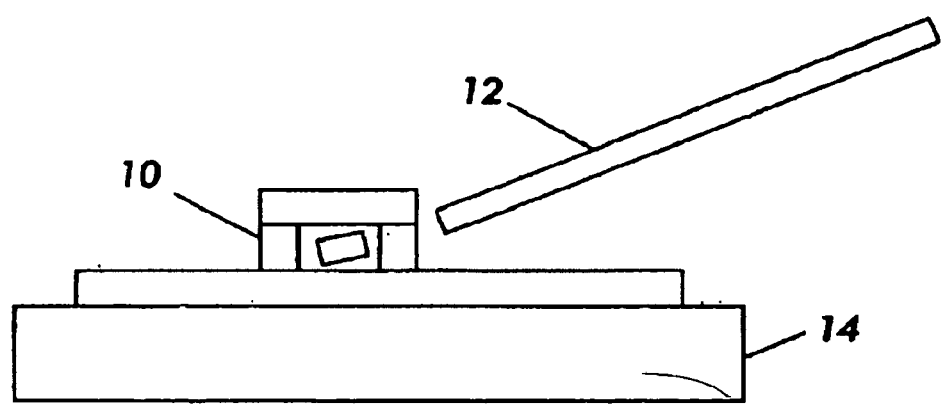
FIG. 1 is directed to a micro-mirrored assembly using multiple polysilicon layers for implementation of a micro-hinge.
Figure 2:
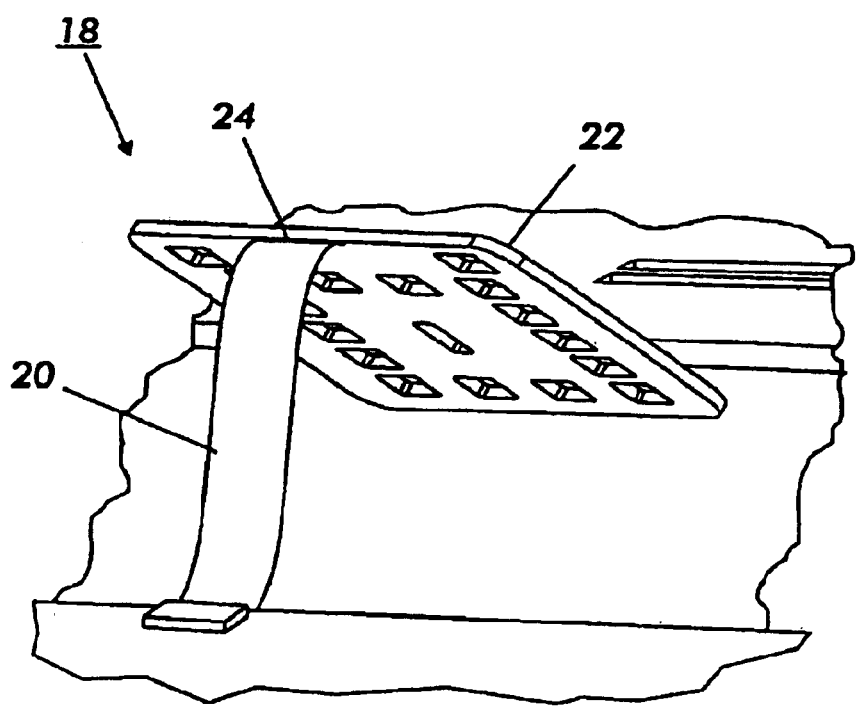
FIG. 2 is an isometric view of a ribbon micro-hinge attached to a micro-device according to the teachings of the present invention.
Figure 3:
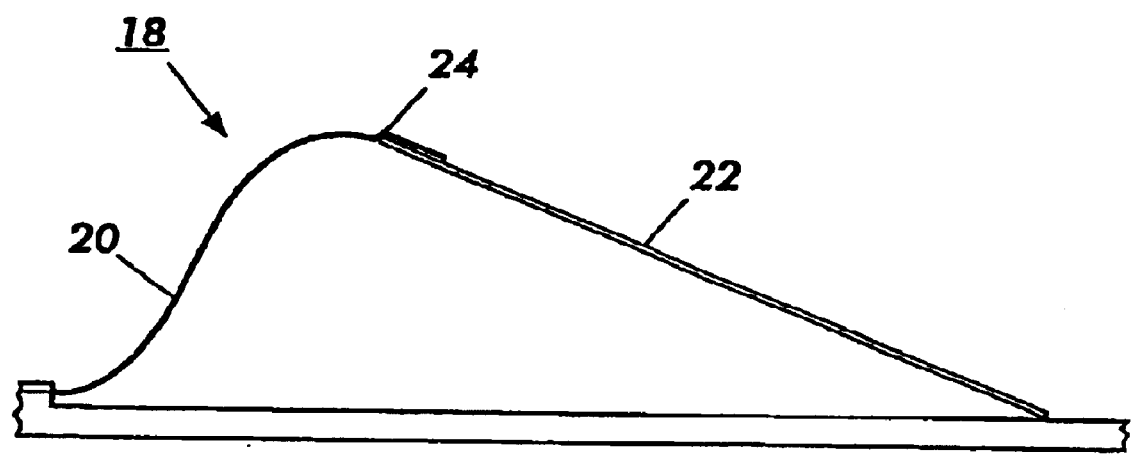
FIG. 3 is a side view of the ribbon hinge and micro-device of FIG. 2.

While FIG. 1 depicts a micro-assembly implementing a polysilicon staple/door-hinge, FIGS. 2 and 3 illustrate a micro-assembly 18 having a ribbon hinge 20 integrated with micro-device 22, such as a micro-mirror. The micro-mirror device 22 has been moved from an in-plane position to an angle of approximately 30°. Particularly, the ribbon hinge structure is configured with a mechanical integrity which permits application of a side-twisting mechanical torque sufficient to twist the ribbon hinge structure to 90° or more from an initial 0° twisted position. Movement of the mirror is achievable by a variety of mechanisms, including the use of a micro-probe or an actuator.

Ribbon hinge 20 is, therefore, designed to replace the widely used polysilicon staple-hinge design illustrated in FIG. 1. Ribbon hinge 20 is a single-crystal-silicon (SCS) component which has mechanical stability, and which is configured using a simplified processing procedure. Thus, ribbon hinge 20 of the present invention provides a flexible mechanism as opposed to the jointed staple-hinge of FIG. 1.

Ribbon hinge 20 is formed from the device layer of a silicon-on-insulator wafer, which has been thinned down to allow increased mechanical flexibility. This design produces a high quality mechanical structure having sufficient strength for its intended purpose.

FIGS. 2 and 3 emphasize the flexibility of ribbon hinge 20. In this embodiment, ribbon hinge 20 is approximately 500 nm thick, approximately 50 $\mu$m wide and approximately 140 $\mu$m in length. Micro-assembly 18, including ribbon hinge 20 and mirror 22 is fabricated using a silicon-on-insulator (SOI) wafer with a device layer thickness of approximately 3 $\mu$m and a buried oxide (BOX) layer thickness of approximately 2 $\mu$m.

In a two-mask process used to manufacture the micro-assembly 18, the bulk area around mirror 22 and other protected areas is etched in a time-etch process leaving approximately 500 nm of the device layer silicon. The ribbon hinge is then patterned and the exposed surrounding 500 nm thick silicon (Si) device layer material is removed in a dry-etch process. This leaves the mirror structure, protected by an oxide layer, and the thin silicon ribbon hinge 20 resting on the sacrificial BOX layer. Following processing (e.g. BOX and Hydrofluoric Acid (HF) 49% processing), and subsequent drying procedures, mirror 22 is freed to move.

As will be discussed in greater detail below, the formation of a micro-assembly having a ribbon hinge and an integrated micro-device is a two-step process in the sense that in the first step a micro-device, such as mirror 22 is patterned and etched. Then a second procedure is used for thinning down and forming ribbon hinge 20. It is of course possible to inverse these processes by thinning the ribbon layer first and then processing the out-of-plane device area. An issue in this regard is that the micro-device and ribbon hinge are all formed from the same material layer. The difference between the ribbon hinge and micro-device is the geometry of the patterning, and the physical thickness of the areas. Etching ribbon hinge 20 to a much thinner cross-section than micro-device 22, permits increased flexibility of the ribbon hinge 20. The flexibility of ribbon hinge 20 is illustrated by its almost S-shape.

The methodology that incorporates fabrication of the ribbon hinge structure in the same material as the out-of-plane device such as the mirror, has many advantages over existing hinge technologies, including a simplified fabrication process. For example, since the hinge is fabricated using the same material layer as that of the micro-device, there is no adhesive joint or holding structure necessary between the hinge and the attached micro-device. Such a design accommodates the high mechanical torque and forces delivered by the attached micro-device without comprising the integrity of connection point 24.

A further advantage of the ribbon hinge configuration discussed above, is to use the ribbon hinges for an electrical connection between the ribbon hinge to the micro-device. Particularly, having ribbon hinge and micro-device formed from the same device layer of the silicon-on-insulator wafer allows for the implementation of a three-dimensional electrically actuated MEMs or micro-assembly. The fabrication process which permits the placement of an electrical connector from a ribbon hinge to a micro-device, is set out in more detail particularly in connection with FIGS. 4–8.

Figure 4:
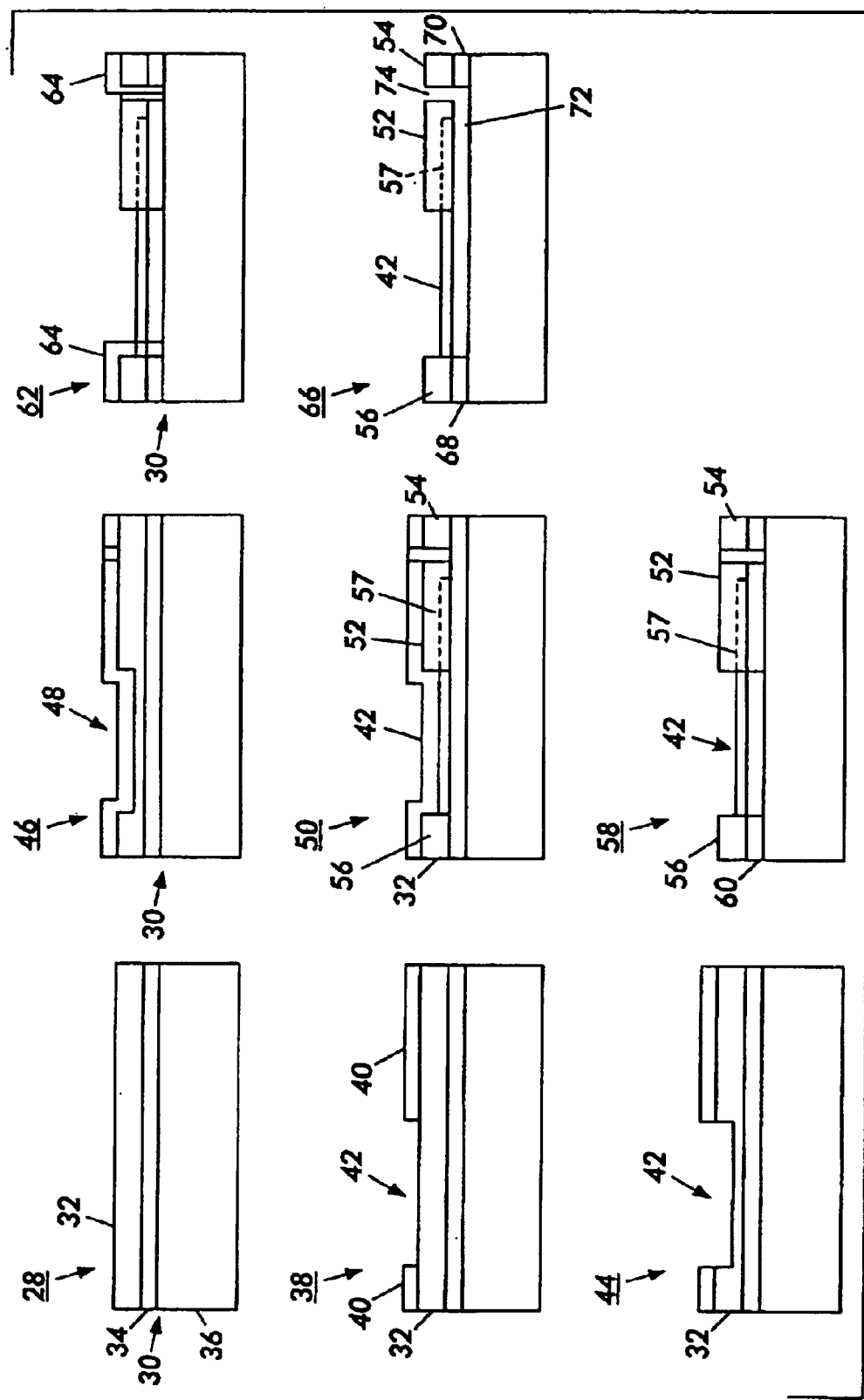
FIG. 4 sets forth the processing steps for formation of the ribbon structure attached to a micro-device in accordance with the teachings of the present invention.

Turning to FIG. 4, illustrated is a process flow for fabrication of a single crystal silicon ribbon hinge integrated with a micro-device, and having an electrical conductor running from ribbon hinge and to the micro-device, according to the present invention. In step 28, the process begins with a clean silicon-on-insulator (SOI) wafer 30 having a single crystal silicon device layer 32, a buried oxide layer 34, and a substrate layer 36. In a first step of the process, 38, a photo-resist layer 40 is deposited on device layer 32 using standard lithographic processes. Photo-resist layer 40 is patterned in such a way as to expose the area to be thinned into the ribbon hinge 42. In a next step 44, a wet etching process is undertaken such as wet etching with a potassium-hydroxide (KOH) 45% solution at 60° C. The wet etching causes the exposed ribbon hinge area 42 of device layer 32 to be removed to a thickness of approximately 500 nm.

In step 46, previously applied resist layer 40 is removed prior to a repatterning for etching of the out-of-plane device, an island area, an anchor structure and an isolation groove.

Following removal of first photo-resist layer 40, second resist layer 48 is applied on the top surface of SOI 30. In step 50, a dry etching process is undertaken on the exposed silicon of device layer 32 to form the out-of-plane micro-device 52, as well as the island area 54, anchor structure 56 and isolation region or groove 57.

Figure 5:
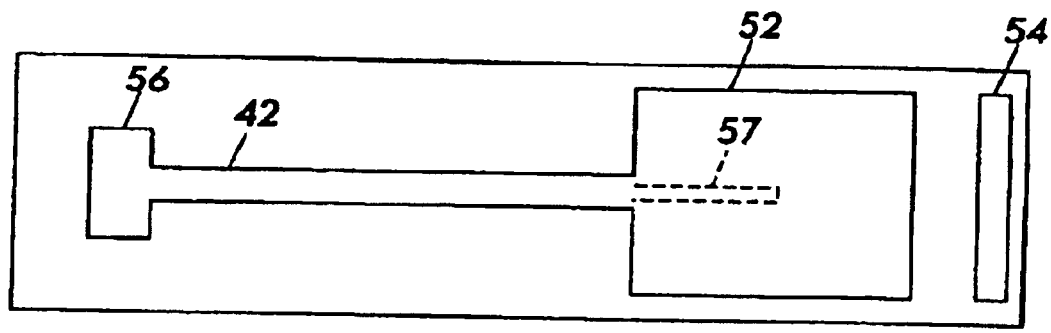
FIG. 5 depicts a top view of the processing of an isolation groove in a micro-device.
Figure 6:
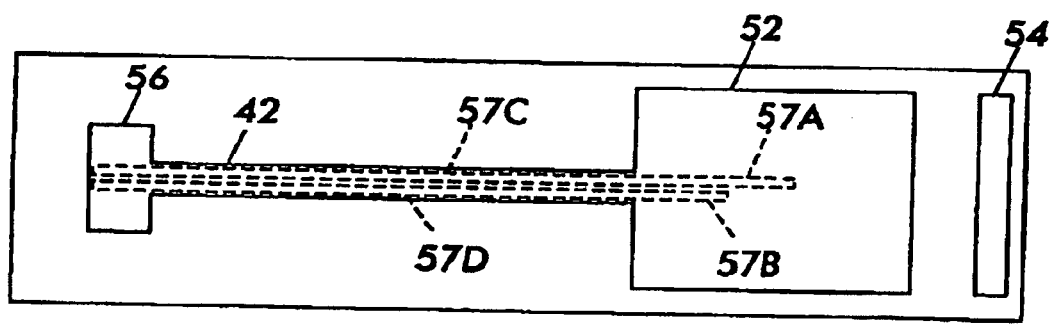
FIG. 6 illustrates a further embodiment of the formation of isolation grooves in the micro-device and the ribbon structure.
Figure 7:
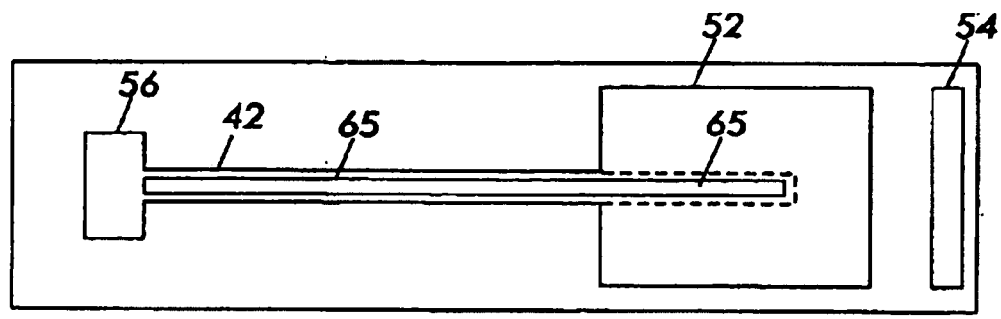
FIG. 7 sets forth a conductor material deposited on the ribbon structure and the isolation grooves.

Turning to FIG. 5, set forth is a top view of step 58 of FIG. 4. Ribbon hinge 42 is shown connected to anchor portion 56 at a first end and to micro-device 52 at a second end. Patterned within micro-device 52 is isolation region 57. As will be discussed in greater detail below, isolation region 57 is patterned within micro-device 52 to isolate an electrical conductor to be deposited therein, from the remainder of micro-device 52. It is to be appreciated that an isolation groove may also be patterned within the ribbon structure 42 and anchor 56. The additional areas where isolation grooves may be etched are shown in FIG. 6, which may be considered a further embodiment of the etching process shown in FIG. 4. Herein, two isolation regions 57A and 57B are etched into micro-device 52. Isolation regions 57C and 57D are also to be etched within ribbon structure 42 through anchor 56. FIG. 6 emphasizes that multiple conductor lines may be processed on a single ribbon hinge 42 and/or micro-device 52. It is also to be understood that multiple ribbon hinges may be attached to a single micro-device.

Returning to FIG. 4, in step 58, the second layer of photo-resist 48 has been removed, and an etching process is started to begin etching the exposed buried oxide layer 60, using a Hydrofluoric Acid (HF) 49% solution.

Next, in step 62, the third and final layer of photo-resist 64 is deposited and patterned on the SOI wafer 30. This final photo-resist layer 64 is to be used during the buried oxide-release (BOX) operation, wherein ribbon hinge 42 and micro-device 52 are released by etching all unprotected buried oxide. Prior to releasing the micro-assembly, as shown more particularly in FIG. 7, a depositing step, deposits an electrical conductive material 65 within isolation region 57 and on ribbon structure 42. It is to be understood that same conductive material may be deposited within the isolation regions 57A–57D of FIG. 6.

Once electrical conductive material 65 has been deposited, the buried oxide release (BOX) operation is undertaken, whereafter, as shown in step 66 of FIG. 4, the only remaining buried oxide layer material 68 and 70 is under the island structure 54 and the anchor section 56. The remaining buried oxide material is removed such that a separation layer 72 and separation edge 74 are void of such material. Removal of the buried oxide allows for the movement of the micro-device 52 and ribbon hinge 42. In step 66, it is noted that all remaining photo-resist is removed, for example, by a dry $O_2$ plasma-etch process.

Thus, step 66 depicts the original SOI wafer 30 as a micro-device and hinge assembly, with a conductor.

Figure 8:
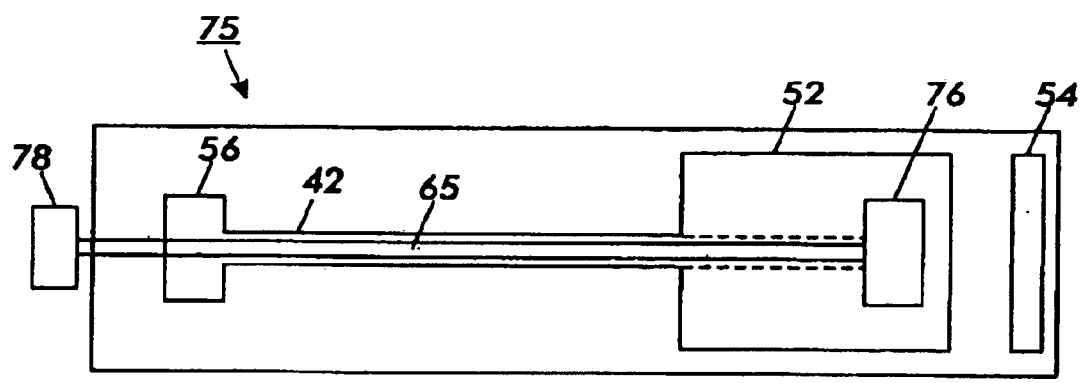
FIG. 8 sets forth a completed structure implementing the concepts of the present invention.

Turning to FIG. 8, set forth is a completed micro-assembly 75 according to the teachings of the present invention. More particularly, a ribbon hinge 42 as described in the foregoing, is integrally attached at a first end to a micro-device 52 and at a second end to an anchor portion 56. Micro-device 52 includes an etched isolation region 57. Deposited within isolation region 57 is a conductive material 65 which is also deposited on ribbon hinge 42 and within an isolation groove of anchor 56. An electronic device 76 is in operational connection to the electrical conductor material 65 within isolation region 57. A power source 78 is in connection with the electrical conductor material 65, at an opposite end by anchor portion 56. Electronic device 76 may be activated upon application of electrical power from electrical power source 78. Further, electrical device 76 may be any one of a number of devices such as an actuator to assist in movement of micro-device 52.

While the present invention is described with respect to a preferred embodiment, it would be apparent to one skilled in the art to practice the present invention into other configurations and designs. Such alternate embodiments would not cause departure from the spirit and scope of the present invention.

Having thus described the preferred embodiments, what is claimed is:

1. A hinge for use in a micro-assembly employing electrical power supplied from an electrical power source, the hinge comprising:
   a silicon-on-insulator wafer including a bottom substrate layer, a middle buried oxide layer and a single crystal silicon device layer;
   a ribbon hinge structure formed in the device layer of the silicon-on-insulator wafer and having an upper outer surface, wherein the ribbon hinge structure is flexible and moves out of the plane of the device layer; and
   an electrical conductor material carried on at least a portion of the upper outer surface of the ribbon hinge structure.

2. The hinge according to claim 1, wherein the electrical conductor material carried on at least a portion of the upper outer surface of the ribbon hinge structure is configured to pass an electrical signal.

3. The hinge according to claim 1, wherein the ribbon hinge structure is configured with a mechanical integrity which permits application of a side-twisting mechanical torque sufficient to twist the ribbon hinge structure to 90° or more from an initial 0° twisted position.

4. The hinge according to claim 1, wherein the ribbon hinge structure has at least one of a width or thickness which is less than at least one of a width or thickness of the micro-assembly.

5. The hinge according to claim 1, wherein the ribbon hinge structure has at least one of (i) an isolation region formed within the ribbon hinge structure, and within which is deposited the electrical conductor material, or (ii) an area of an insulation material which has been deposited and then patterned on the ribbon hinge structure, wherein conductors can then be placed on top of the insulation material.

6. A micro-assembly comprising:
   a micro-device formed in a device layer of a single crystal silicon substrate;
   a ribbon structure formed on or in the device layer, the ribbon structure having been thinned to a thickness which is less than the thickness of the micro-device;
   a connection interface providing a connection point between a first end of the micro-device and a first end of the ribbon structure; and
   an electrical conductor material extending along an upper outer surface of the ribbon structure to an operational association with the micro-device to pass an electrical signal to the micro-device.

7. The micro-assembly according to claim 6, further including an anchor portion holding one end of the ribbon structure in a secure position.

8. The micro-assembly according to claim 7, wherein the anchor portion is formed with an isolation groove, within which is deposited an isolation region of the anchor portion.

9. The micro-assembly according to claim 6, wherein the micro-device includes an isolation region, formed within the micro-device, and in which the electrical conductor material is deposited.

10. The micro-assembly according to claim 6 further including an isolation region formed within the ribbon structure, and within which is deposited the electrical conductor material.

11. The micro-assembly according to claim 6, wherein the device layer is formed as part of a silicon-on-insulator wafer, including at least the device layer and a buried oxide layer.

12. The micro-assembly according to claim 6, wherein the ribbon structure has at least one of a width or thickness which is less than at least one of a width or thickness of the micro-device.

13. The micro-assembly according to claim 6, wherein the micro-device is fabricated from a silicon-on-insulator wafer which has an initial uniform device layer thickness.

14. The micro-assembly according to claim 6, wherein the ribbon structure is configured with a mechanical integrity which permits application of a side-twisting mechanical torque to the micro-device sufficient to twist the micro-device to 90° or more from an initial 0° twisted position.

15. The micro-assembly according to claim 6, wherein the ribbon structure is configured with a mechanical integrity which permits application of a lifting out-of-plane mechanical torque to lift the micro-device from 0° which is in a horizontal plane, to 90° or more out of the horizontal plane.

16. The micro-assembly according to claim 6 further including an electronic device in operational connection to the electrical conductor material.

17. The micro-assembly according to claim 6 further including a power source in connection with the electrical conductor material.

18. The micro-assembly according to claim 6, wherein the electrical conductor material is located on an upper outer surface of the ribbon hinge structure.

19. A micro-assembly comprising:
   a micro-device formed on a device layer of a single crystal silicon substrate;
   a ribbon structure formed on the device layer, the ribbon structure having been thinned to a thickness which is less than the thickness of the micro-device;
   an electronic device in operative connection with the micro-device;
   an anchor portion formed on the device layer, and holding one end of the ribbon structure in a secure position, and configured to receive power from an external power source;
   a connection interface providing a connection point between a first end of the micro-device and a first end of the ribbon structure; and
   an electrical conductor material extending along the anchor portion and an upper outer surface of the ribbon structure to make a connection with the electronic device in operable connection with the micro-device.

20. The micro-assembly according to claim 19 further including a power source in operative connection with the electrical conductive material of the anchor portion.

* * * * *